(12) United States Patent
Huang et al.

(10) Patent No.: US 7,746,693 B2
(45) Date of Patent: Jun. 29, 2010

(54) NONVOLATILE ANALOG MEMORY

(75) Inventors: Cheng-Da Huang, Taipei (TW);
Chih-Cheng Lu, Tainan (TW); Hsin Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 67 days.

(21) Appl. No.: 12/192,137

(22) Filed: Aug. 15, 2008

(65) Prior Publication Data

US 2009/0257276 A1 Oct. 15, 2009

(30) Foreign Application Priority Data

Apr. 11, 2008 (TW) ............................... 97113243 A

(51) Int. Cl.
*G11C 16/04* (2006.01)
(52) U.S. Cl. .............................. 365/185.03; 365/185.21
(58) Field of Classification Search ............ 365/185.03, 365/185.21, 185.26
See application file for complete search history.

(56) References Cited

U.S. PATENT DOCUMENTS

| 5,638,320 | A | * | 6/1997 | Wong et al. | ............ | 365/185.03 |
| 5,745,414 | A | * | 4/1998 | Engh et al. | ................ | 365/185.2 |
| 2005/0099859 | A1 | * | 5/2005 | Diorio et al. | ................ | 365/200 |

OTHER PUBLICATIONS

Article titled "CMOS-micromachined, Two-dimenisional Transistor Arrays for Neural Recording" authored by Jia Shian Lin, Institute of Electronics Engineering, National Tsing Hua University, 2007, pp. 1-78.

* cited by examiner

*Primary Examiner*—Vu A Le
(74) *Attorney, Agent, or Firm*—Jianq Chyun IP Office

(57) ABSTRACT

A nonvolatile analog memory has a floating gate point. The nonvolatile analog memory includes a first current source, a second current source, and a current adjuster. The first current source generates a first current, and the second current source generates a second current. The current adjuster turns on or turns off a current path of the second current according to a reference current and the first current. Furthermore, when the current path of the second current is turned on, the first current is adjusted according to the second current, such that the first current is equal to the reference current.

13 Claims, 9 Drawing Sheets

NONVOLATILE ANALOG MEMORY

CROSS-REFERENCE TO RELATED APPLICATION

This application claims the priority benefit of Taiwan application serial no. 97113243, filed on Apr. 11, 2008. The entirety of the above-mentioned patent application is hereby incorporated by reference herein and made a part of this specification.

BACKGROUND OF THE INVENTION

1. Field of the Invention

The present invention relates to a memory. More particularly, the present invention relates to a nonvolatile analog memory.

2. Description of Related Art

With an advancement of electronic technologies, electronic devices have become indispensable in our daily lives. Owing to increasing demands on information, almost all of the electronic devices currently on the market are equipped with memories for data storage. In the past, various digital memories have been widely proposed. The digital memories include dynamic random access memories (DRAMs) and read only memories (ROMs).

However, one of the common issues encountered by the aforesaid digital memories lies in that one memory cell is required for correspondingly storing each bit of data. Nowadays, as memory capacities required in the electronic products are increasing, more and more memory cells are required. Accordingly, physical dimensions of the memories are also increased. The increasing dimensions of the memories lead to difficulties not only in designing the memories but also in controlling manufacturing yield of memory chips. Moreover, it is more challenging to design chips in which embedded memories are needed.

In view of the above, some nonvolatile analog memories in which stored data is represented by an analog signal are further developed. It is well known that when the data to be stored is in a form of the analog signal, only one memory cell is required for storing a plurality of bits of data, whereas a plurality of memory cells are needed to store the plurality of bits of data in the conventional digital memory. As such, the required number of the memory cells can be significantly reduced, and the area occupied by circuits can also be decreased.

The amount of the bits of data which can be stored in a single memory cell of the analog memory is determined upon the accuracy of the analog signals stored therein. Nonetheless, it is rather difficult to store an accurate analog signal in the analog memory. First, it should be determined whether the written voltage or the written current value is accurately identical to the voltage or the current value representing the data intended to be written. Moreover, it should be further assured an excessive drift of the written voltage/the written current value does not occur when reading the data stored in the memory. Otherwise, the stored data is likely to be altered.

SUMMARY OF THE INVENTION

The present invention is directed to a nonvolatile analog memory capable of storing data by storing a current.

The present invention is further directed to a nonvolatile analog memory capable of storing data by performing charging and discharging operations.

In the present invention, a nonvolatile analog memory having a floating gate point is provided. The nonvolatile analog memory includes a first current source, a second current source, and a current adjuster. The first current source is controlled by a voltage value at the floating gate point and generates a first current. The second current source generates a second current. The current adjustor receives the first current, the second current, and a reference current. Besides, the current adjustor turns on or turns off a current path of the second current according to the reference current and the first current. When the current path of the second current is turned on, the first current is adjusted, so as to equalize the first current to the reference current.

In the present invention, a nonvolatile analog memory having a floating gate point is further provided. The nonvolatile analog memory includes a capacitor, a first current source, a second current source, and a current adjuster. An end of the capacitor is coupled to the floating gate point, while the other end generates an output voltage. The first current source generates a first current, and the second current source generates a second current. The current adjuster receives the output voltage and a reference voltage and adjusts the first current and the second current based on the output voltage and the reference voltage. Moreover, the current adjuster charges or discharges the capacitor, so as to equalize the output voltage to the reference voltage.

In the present invention, the adjustment of the currents enables analog signals to be written into the nonvolatile analog memory. Hence, the data can be stored in an accurate manner. Additionally, the voltage value stored in the nonvolatile analog memory is linearly and bi-directionally adjusted in the present invention, and then the analog signal is stored in the nonvolatile analog memory. As such, the data stored in the nonvolatile analog memory can be stabilized, and the correctness of the data can be guaranteed.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

A first embodiment of the present invention is provided hereinafter along with drawings to describe an operational manner of a nonvolatile analog memory.

Figure 1:
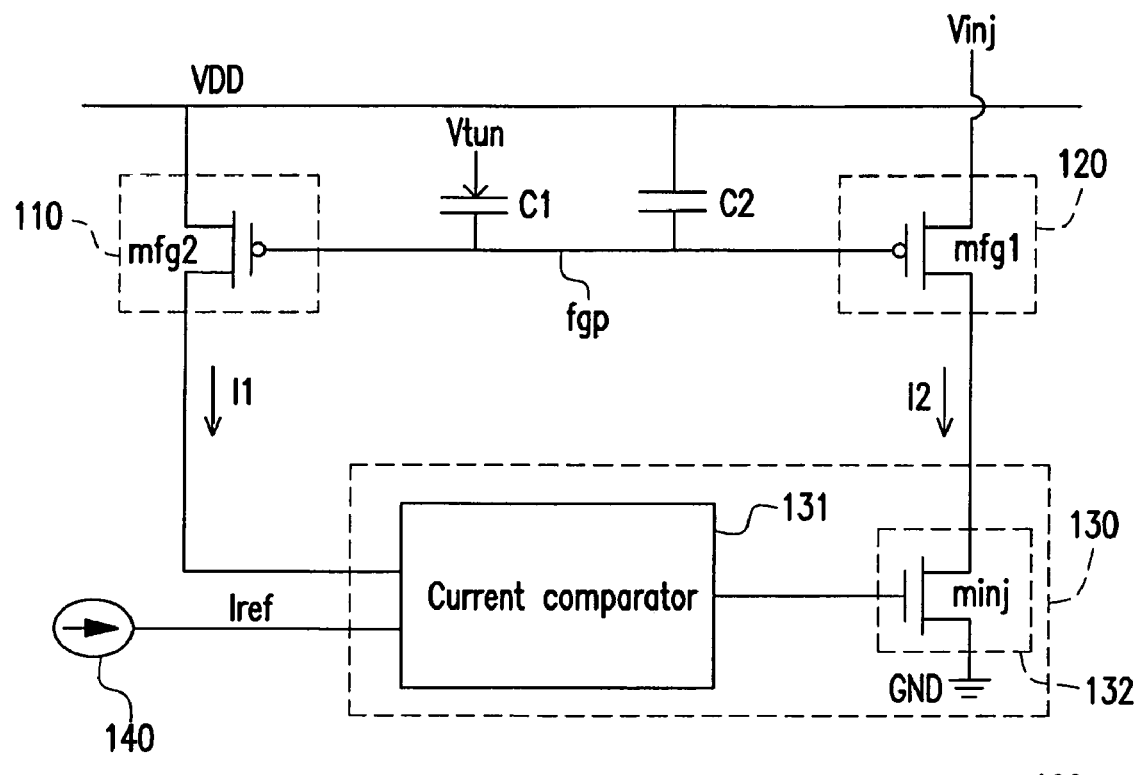
FIG. 1 is a schematic view of a nonvolatile analog memory according to a first embodiment of the present invention.

Please refer to FIG. 1 which is a schematic view of a nonvolatile analog memory 100 according to the first embodiment of the present invention The nonvolatile analog memory 100 includes a current source 110, a current source 120, a current adjuster 130, capacitors C1 and C2, and a reference current source 140.

In the first embodiment, the current source 110 is formed by a transistor mfg2. A first source/drain of the transistor mfg2 is coupled to a system voltage VDD. A gate of the transistor mfg2 is controlled by a voltage applied to a floating gate point fgp, and a current I1 is generated at a second source/drain of the transistor mfg2. By contrast, the current source 120 is formed by a transistor mfg1. A first source/drain of the transistor mfg1 is coupled to a voltage Vinj. A gate of the transistor mfg1 is controlled by the voltage applied to the floating gate point fgp, and a current I2 is generated at a second source/drain of the transistor mfg1.

The current adjustor 130 includes a current comparator 131 and a switch 132. The current comparator 131 receives the current I1 and a reference current Iref generated by the reference current source 140. Besides, the current comparator 131 controls the switch 132 by measuring the current I1 and the reference current Iref. When the current I1 is less than the reference current Iref, the switch 132 is enabled. On the contrary, when the current I1 is not less than the reference current Iref, the switch 132 is disabled. Since the switch 132 is serially connected to a current path of the current I2, the enabling/disabling of the switch 132 results in an on/off state of the current path of the current I2. In the first embodiment, the switch 132 is formed by a transistor minj. A gate of the transistor minj is coupled to the current comparator 131, a first source/drain of the transistor minj receives the current I2, and a second source/drain of the transistor minj is coupled to a ground voltage GND.

When a user intends to write data into the nonvolatile analog memory 100, the data to be written into the nonvolatile analog memory 100 is first represented by the reference current Iref generated by the reference current source 140. Next, a voltage Vtun is applied to a floating terminal of the capacitor C1, and a Fowler-Nordheim (FN) tunneling is conducted for increasing the voltage value at the floating gate point fgp. In the first embodiment, the transistor mfg2 constituting the current source 110 is a P-type metal oxide semiconductor field effect transistor (P-MOSFET), and therefore the increase in the voltage value at the floating gate point fgp gives rise to a reduction of the current I1. When the current I1 is reduced to be less than the reference current Iref, the current comparator 131 enables the switch 132 and turns on the current path of the current I2.

Here, the current I2 is generated by the current source 120. Thereby, the voltage value at the floating gate point fgp is changed, and the current I1 is increased. The current I1 is continuously increased until the current I1 is equal to the reference current Iref. When the current I1 is equal to the reference current Iref, the switch 132 is again disabled, and the data writing operation is completed.

Note that after the data writing operation is completed, the reference current source 140 can then be removed. Because the voltage value at the floating gate point fgp stays unchanged, the current I1 can be memorized in the nonvolatile analog memory 100. In addition, the capacitor C2 is further connected between the floating gate point fgp and the system voltage VDD for stabilizing the voltage value at the floating gate point fgp when the transistor minj is turned on or turned off.

Figure 2:
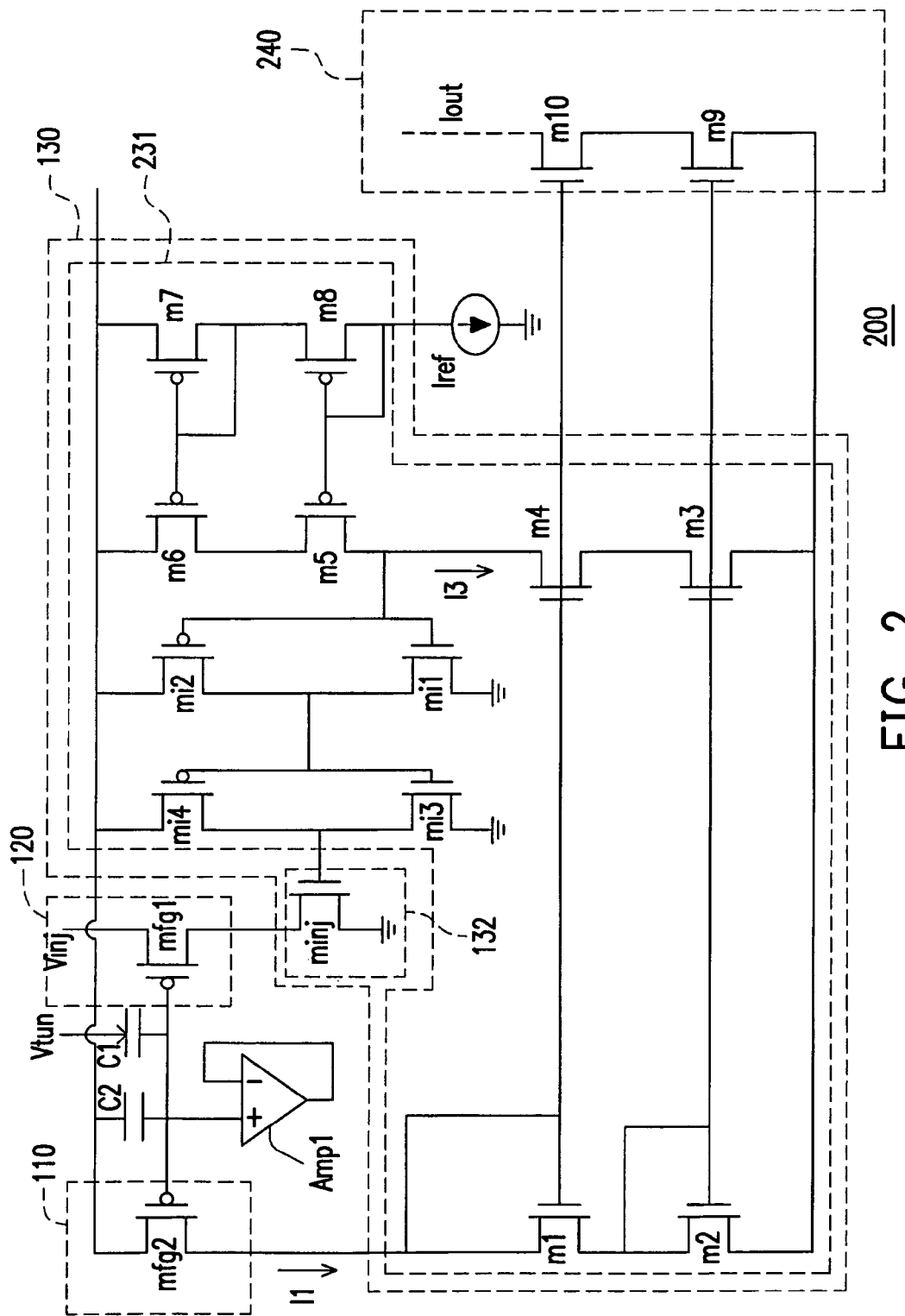
FIG. 2 illustrates an example of the first embodiment of the present invention.

An example of the first embodiment as shown in FIG. 2 is provided hereinafter to further elaborate the first embodiment of the present invention.

As indicated in FIG. 2, the current comparator 231 obtains a current I3 by means of a current mirror constituted by transistors m1~m4. Here, the current I3 is generated by mirroring the current I1, and the current I3 is equal to the current I1 when the current mirror constituted by the transistors m1~m4 is a 1:1 current mirror. In addition, another 1:1 current mirror constituted by transistors m5~m8 generates a mirror current of the reference current Iref. After comparing the mirror current with the current I3, the comparison result is output to the switch 132 through two invertors constituted by transistors mi1~mi4, so as to disable/enable the switch 132.

Moreover, in order to read the data from a nonvolatile analog memory 200, an output circuit 240 is additionally disposed. The output circuit 240 is formed by serially connecting transistors m10 and m9, and the transistors m10 and m9 and the transistors m1 and m2 together form a current mirror. Thereby, a current Iout can be generated by mirroring the current I1. Since the current Iout generated by the output circuit 240 can be measured without disturbing the current I1, the current Iout can serve as a channel to read the data from the nonvolatile analog memory 200.

In addition, the voltage value at the floating gate point fgp is not able to be directly measured by instruments because probes of the instruments would impair the voltage value at the floating gate point fgp. Thus, an amplifier AMP1 coupled to a unit gain buffer is disposed to output the voltage value at the floating gate point fgp in the present embodiment. The output end of the amplifier AMP1 is coupled to one input end thereof, while the other input end of the amplifier AMP1 is coupled to the floating gate point fgp. A voltage value at the output end of the amplifier AMP1 is identical to the voltage value at the floating gate point fgp.

Figure 3:
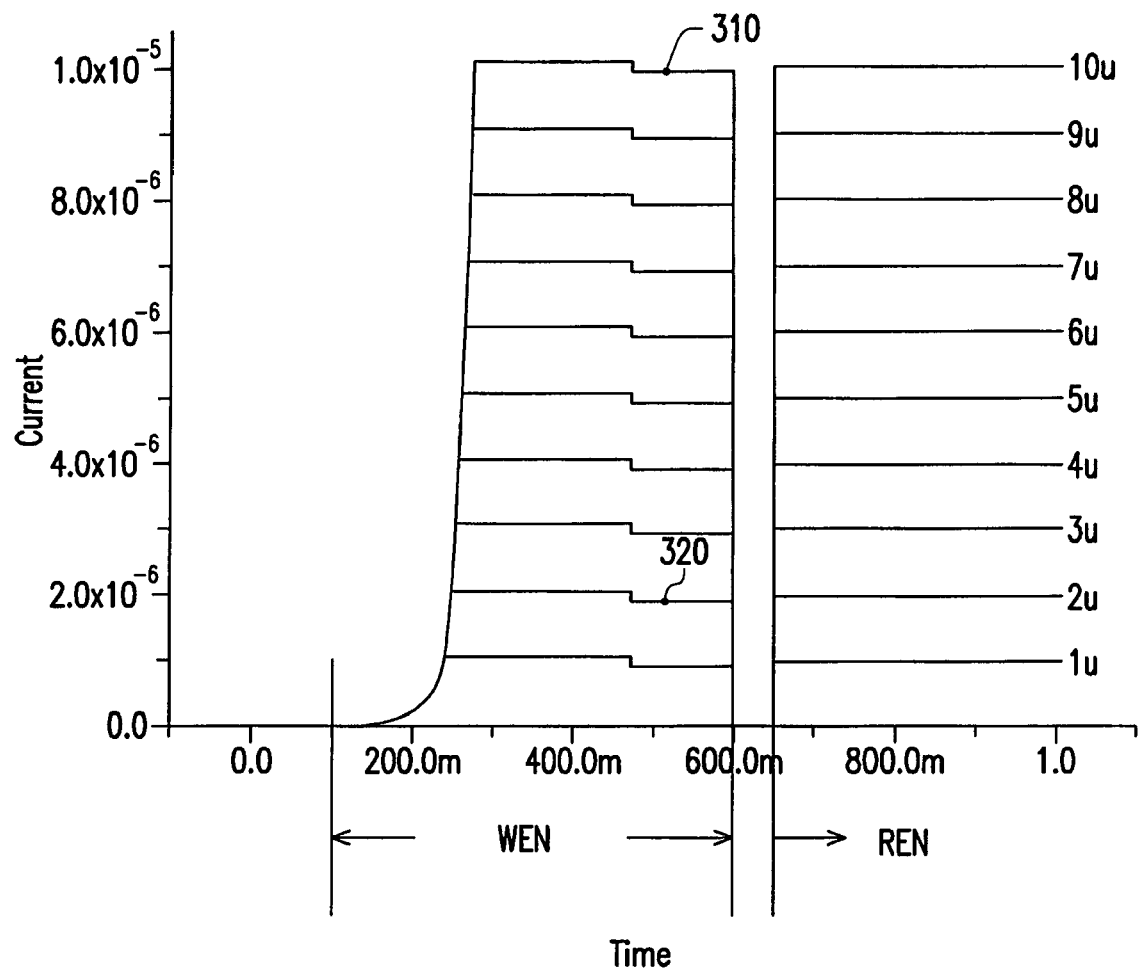
FIG. 3 illustrates a relationship between time and a current I1. Here, the current I1 of different values is respectively written into a nonvolatile analog memory 200.

Next, please refer to FIG. 3 which illustrates a relationship between time and the current I1. Here, the current I1 of different values is respectively written into the nonvolatile analog memory 200. During a writing period WEN, the current written into the nonvolatile analog memory 200 has different values. For instance, curves 310 and 320 respectively represent that the values of the written current I1 remain constant before the time reaches 250 mini seconds (ms). Similarly, the values of the written current I1 stay unchanged and are continuously output during a reading period REN.

Figure 4:
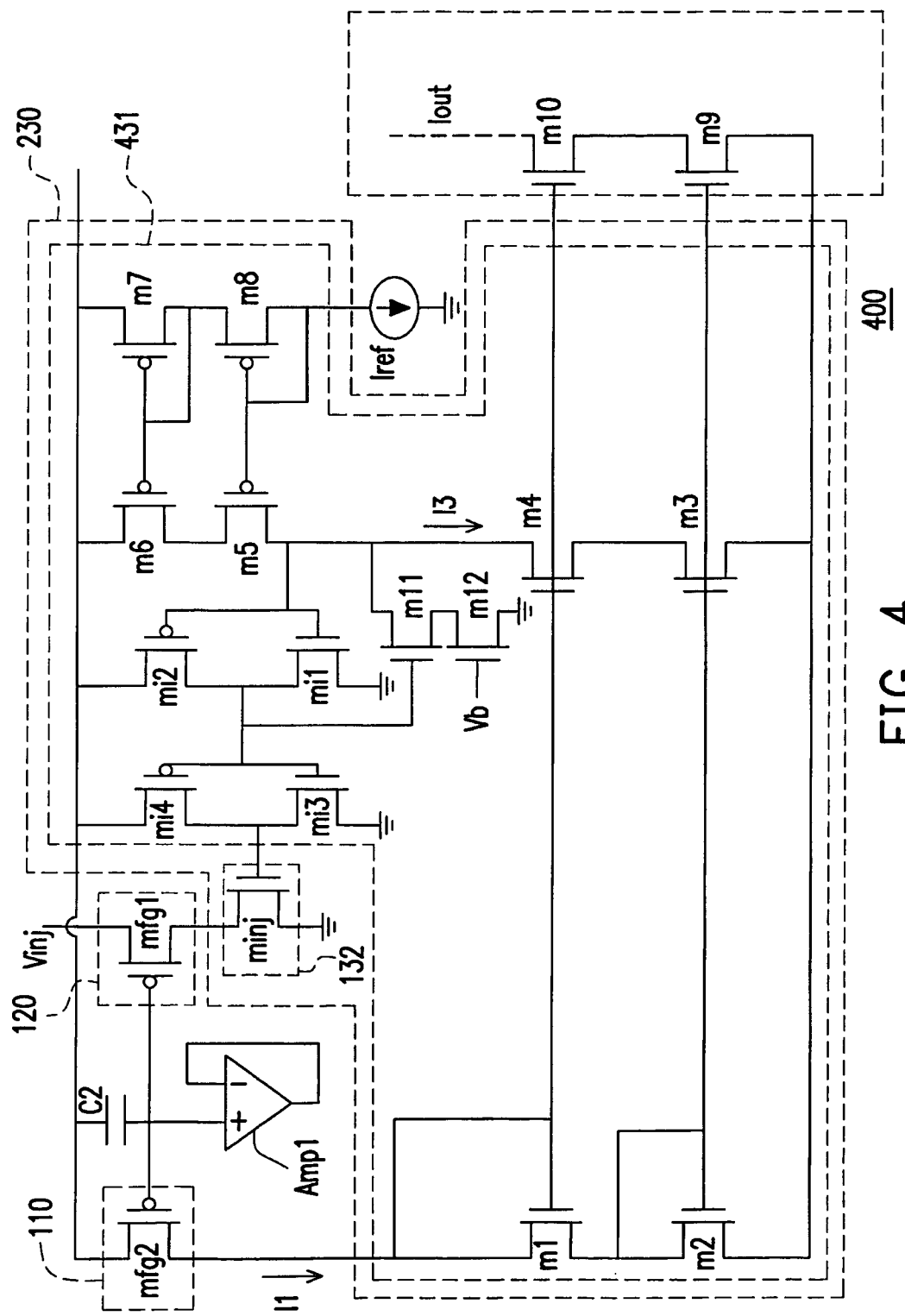
FIG. 4 illustrates another example of the first embodiment of the present invention.

On the other hand, note that a hysteresis current comparator can be used as the current comparator of the present embodiment for further stabilizing the nonvolatile analog memory. Please refer to FIG. 4 which illustrates another example of the first embodiment of the present invention.

Here, transistors m11 and m12 are serially connected between an input end and an output end of an inverter constituted by the transistors mi1 and mi2. A voltage Vb received by a gate of the transistor m12 determines a hysteresis bandwidth. After a hysteresis circuit is additionally formed, the switch 132 is disabled by a current comparator 431 only when the current I3 is greater than the total of the reference current Iref and the hysteresis bandwidth. Likewise, the switch 132 is enabled by the current comparator 431 only when the reference current Iref is greater than the total of the current I3 and the hysteresis bandwidth. Thereby, when the reference current Iref is substantially equal to the current I3, an issue regarding the switch 132 repetitively disabled/enabled by the current comparator 431 can be resolved.

The following table 1 indicates simulated results of a relationship between the stored current and the read current according to the first embodiment. The simulation is conducted upon different manufacturing conditions ff, fs, sf, ss, and tt. Here, ff denotes a simulation model selected from a fast P-type transistor and a fast N-type transistor, fs denotes a simulation model selected from the fast P-type transistor and a slow N-type transistor, sf denotes a simulation model selected from a slow P-type transistor and the fast N-type transistor, ss denotes a simulation model selected from the slow P-type transistor and the slow N-type transistor, and tt denotes a simulation model selected from a standard P-type transistor and a standard N-type transistor.

TABLE 1

|  | ss | sf | fs | tt | ff |
|---|---|---|---|---|---|
| 1 uA | 1.016 uA | 0.992 uA | 0.992 uA | 1.016 uA | 0.992 uA |
| 2 uA | 1.991 uA | 1.987 uA | 1.989 uA | 1.990 uA | 2.033 uA |
| 3 uA | 2.993 uA | 2.988 uA | 2.990 uA | 2.990 uA | 2.990 uA |
| 4 uA | 3.992 uA | 3.989 uA | 4.058 uA | 3.990 uA | 3.990 uA |
| 5 uA | 4.998 uA | 4.994 uA | 4.996 uA | 4.993 uA | 5.071 uA |
| 6 uA | 5.994 uA | 5.995 uA | 6.076 uA | 6.068 uA | 6.035 uA |
| 7 uA | 7.038 uA | 7.006 uA | 7.085 uA | 7.082 uA | 7.033 uA |
| 8 uA | 8.079 uA | 8.001 uA | 8.072 uA | 8.010 uA | 8.003 uA |
| 9 uA | 9.002 uA | 9.012 uA | 9.004 uA | 9.032 uA | 9.107 uA |
| 10 uA | 10.008 uA | 10.115 uA | 10.011 uA | 10.002 uA | 10.014 uA |

It can be clearly observed from Table 1 that the maximum error occurs when the written current is 10 uA and the simulation model is sf. The written current ranges from 1 uA to 10 uA, and therefore the resolution can reach 6 bits on condition that 9 u (the written current)/0.115 u (the maximum error)=78.

Second Embodiment

To allow people skilled in the art to better recognize and embody the present invention, a second embodiment is detailed in following paragraphs.

Figure 5:
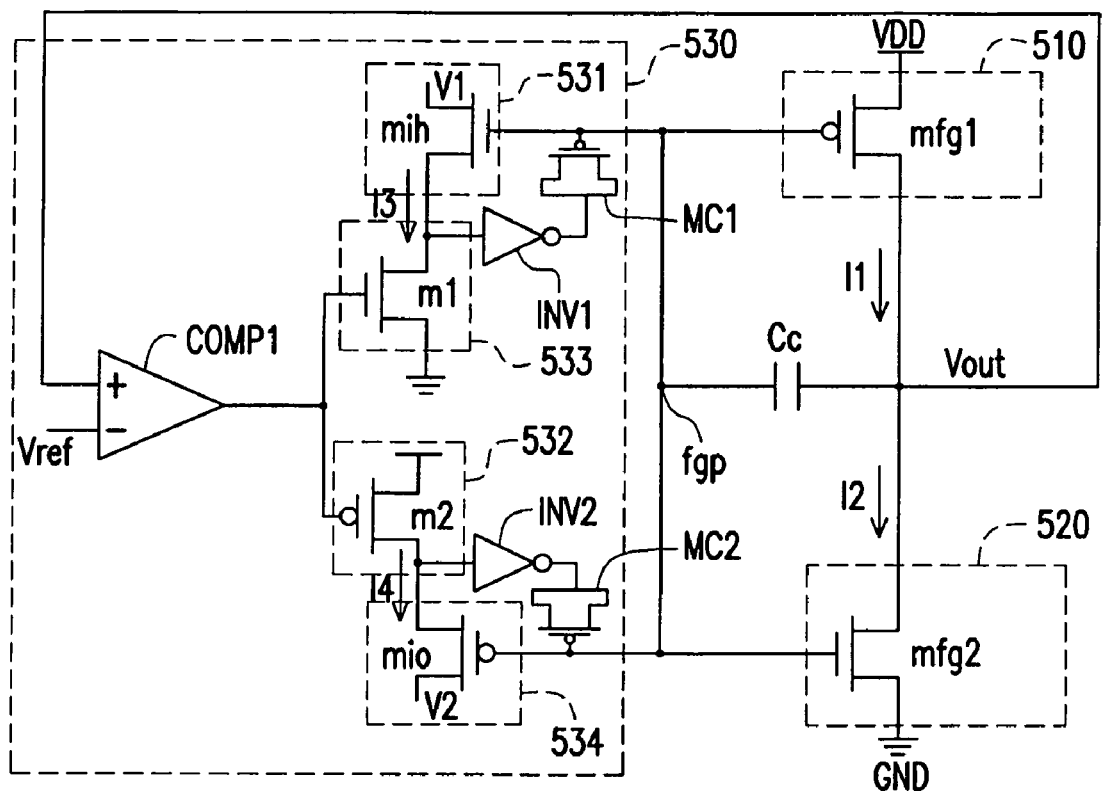
FIG. 5 is a schematic view of a nonvolatile analog memory according to a second embodiment of the present invention.

Please refer to FIG. 5 which is a schematic view of a nonvolatile analog memory 500 according to the second embodiment of the present invention The nonvolatile analog memory 500 includes current sources 510 and 520, a current adjustor 530, and a capacitor Cc. The current adjustor 530 includes a comparator COMP1, switches 532 and 533, and current sources 531 and 534. The current sources 510 and 520 are respectively constituted by transistors mfg1 and mfg2. Here, both of the current sources 510 and 520 are controlled by a voltage value at a floating gate point fgp and respectively generate currents I1 and I2.

The current adjustor 530 disables/enables the switches 532 and 533 by using the comparator COMP1 to compare a feedback voltage Vout with a reference voltage Vref. According to the second embodiment, the switches 532 and 533 are respectively formed by a P-MOSFET m2 and an N-type metal oxide semiconductor field enhancement transistor (N-MOSFET) m1. Hence, the disabling/enabling of the switch 532 is reverse to the disabling/enabling of the switch 533. That is to say, when the switch 532 is enabled, the switch 533 is disabled. When the switch 533 is enabled, the switch 532 is disabled.

Besides, the current source 531 generates a current I3 when the switch 533 is enabled. Likewise, the current source 534 generates a current I4 when the switch 532 is enabled. In light of the disabling/enabling of the switches 532 and 533 stated above, it is evident the currents I3 and I4 are not generated simultaneously.

When a user intends to write data into the nonvolatile analog memory 500, the data to be written into the nonvolatile analog memory 500 is represented by the reference voltage Vref. Since the feedback voltage Vout received by the comparator COMP1 is not equal to the reference voltage Vref, the output of the comparator COMP1 is accordingly changed. When the reference voltage Vref is greater than the feedback voltage Vout, the comparator COMP1 enables the switch 532 and disables the switch 533. At the same time, ionized hot electrons injected to a source point of a transistor mio flow to the floating gate point fgp, and the voltage at the floating gate point fgp is slightly changed (decreased). Additionally, since the current I1 generated by the current source 510 is greater than the current I2 generated by the current source 520, the feedback voltage Vout continues to be linearly increased until the feedback voltage Vout is equal to the reference voltage Vref.

On the contrary, when the reference voltage Vref is not greater than the feedback voltage Vout, the comparator COMP1 enables the switch 533 and disables the switch 532. At the same time, ionizied hot holes injected to a drain point of a transistor mih flow to the floating gate point fgp, and the voltage at the floating gate point fgp is slightly changed (increased). Additionally, since the current I1 generated by the current source 510 is less than the current I2 generated by the current source 520, the feedback voltage Vout continues to be linearly decreased until the feedback voltage Vout is equal to the reference voltage Vref.

Moreover, in order to allow the transistors mio and mih to generate the ionizied hot electron flow and the ionizied hot hole flow in a more effective manner, the transistors mio and mih respectively receive voltages V1 and V2 as voltage sources. Here, the voltage V1 is greater than a system voltage VDD, while the voltage V2 is lower than a ground voltage GND. Moreover, to better stabilize the voltage value at the floating gate point fgp during a switching operation between switches m1 and m2, an inverter INV1 and a capacitor MC1 are further connected between the current source 531 and the floating gate point fgp in series, and an inverter INV2 and a capacitor MC2 are serially connected between the current source 534 and the floating gate point fgp.

As stated above, in the nonvolatile analog memory 500, the ionizied hot electron flow and the ionizied hot hole flow can be correspondingly generated simply by means of the inverters INV1 and INV2, and the data to be memorized is then linearly and bi-directionally written into the nonvolatile analog memory 500.

Figure 6:
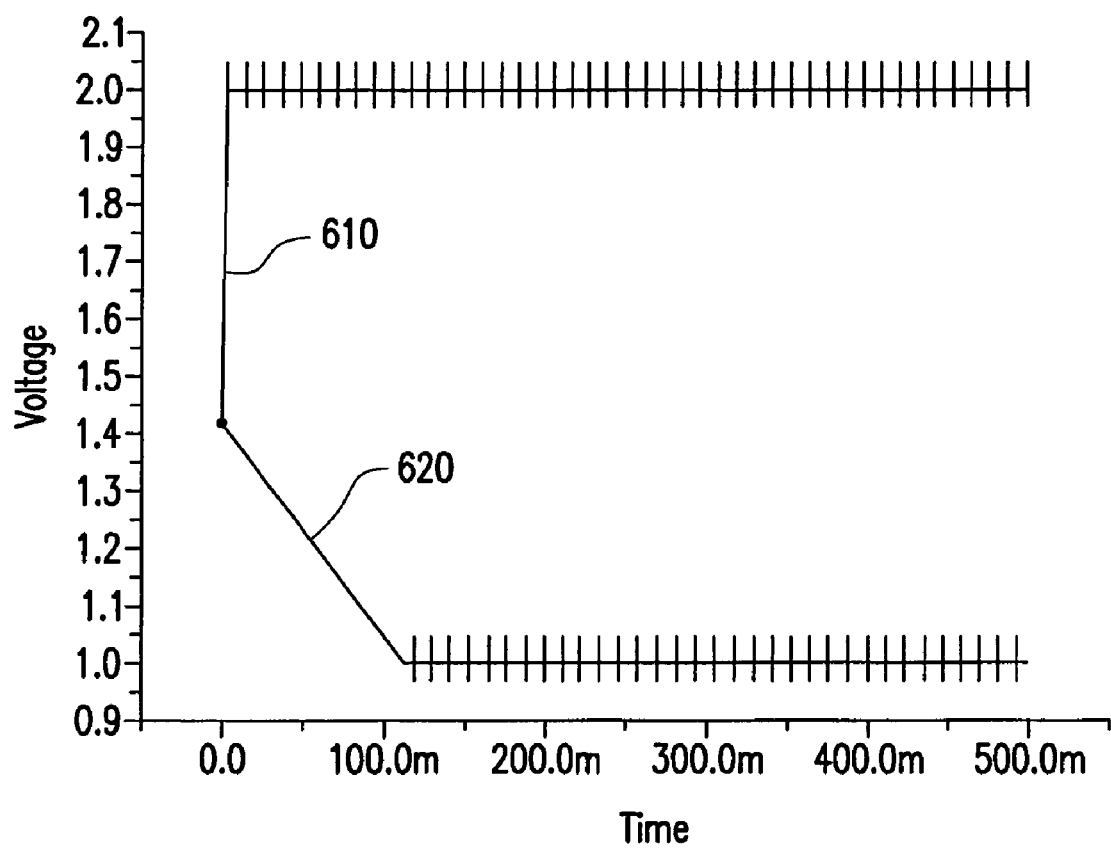
FIG. 6 illustrates a relationship between a feedback voltage Vout and time according to the second embodiment of the present invention.

Thereafter, please refer to FIG. 6 which illustrates a relationship between the feedback voltage Vout and time according to the second embodiment of the present invention. A curve 610 indicates variations of the feedback voltage Vout along with time on condition that the reference voltage Vref is predetermined as 2.0 volts (V), i.e., the data having a value of 2.0V is to be written. It can be learned from the curve 610 that the value of the feedback voltage Vout stays at 1.4V when the time is at 0 sec. As time goes by, the value of the feedback voltage Vout rapidly reaches 2.0V, and the data writing operation is completed.

Further, a curve 620 indicates variations of the feedback voltage Vout along with time on condition that the reference voltage Vref is predetermined as 1.0V, i.e., the data having a value of 1.0V is to be written. It can be learned from the curve 620 that the value of the feedback voltage Vout stays at 1.4V when the time is at 0 sec. As time goes by, the value of the feedback voltage Vout is gradually reduced to 1.0V, and the data writing operation is completed as well.

However, as shown in FIG. 6, the curves 610 and 620 oscillate rather than stay constant after the data writing operation is completed. This is because the switches 533 and 532 are repetitively disabled/enabled by the comparator COMP1 of the nonvolatile analog memory 500 when the reference voltage Vref has a value extremely similar to the value of the feedback voltage Vout. To resolve said problem, a hysteresis comparator is further applied in the present invention, which is described hereinafter.

Figure 7A:
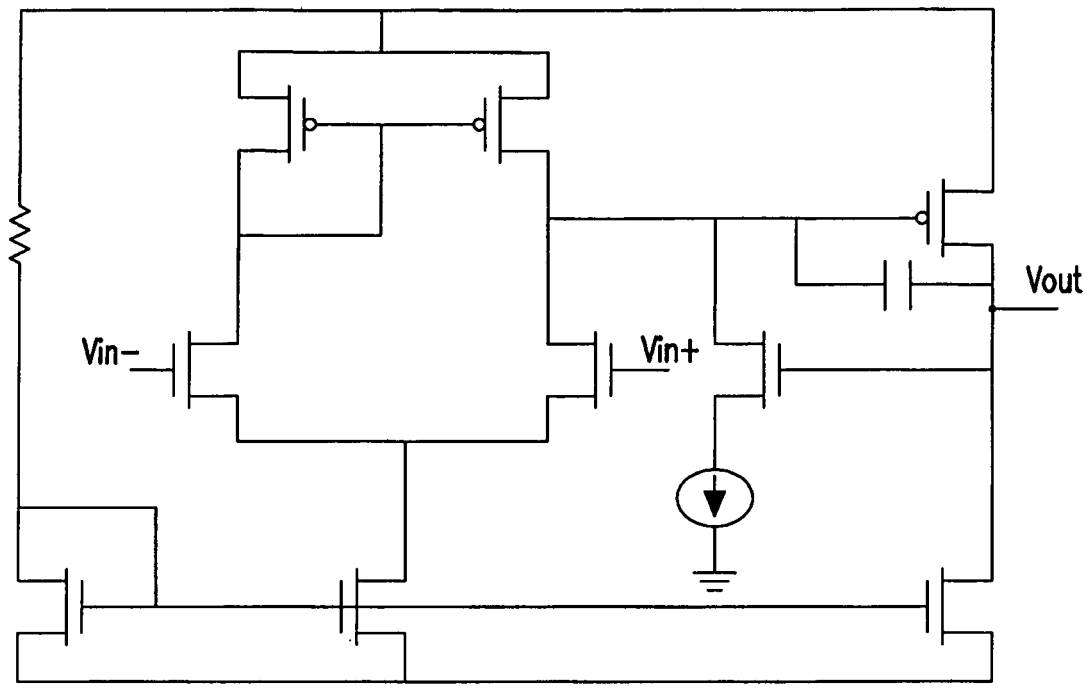
FIG. 7A illustrates an example of a comparator COMP1.
Figure 7B:
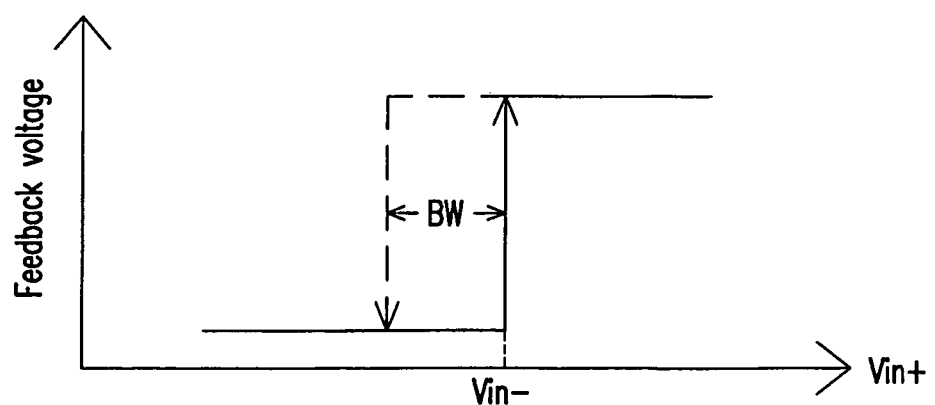
FIG. 7B illustrates a relationship between input voltages and a feedback voltage output by the comparator depicted in FIG. 7A.

Please refer to FIGS. 7A and 7B. FIG. 7A illustrates an example of the comparator COMP1, and FIG. 7B illustrates a relationship between input voltages and the feedback voltage output by the comparator depicted in FIG. 7A. The comparator depicted in FIG. 7A is the hysteresis comparator, and the feedback voltage Vout generated by the hysteresis comparator is not directly determined upon comparing an input voltage Vin+ with an input voltage Vin− respectively received by the hysteresis comparator. As shown in FIG. 7B, when the input voltage Vin+ is increased little by little to be greater than the input voltage Vin−, the feedback voltage Vout is output at a high level. After that, when the input voltage Vin+ is gradually decreased to be less than the input voltage Vin−, the feedback voltage Vout stays unchanged. After the input voltage Vin+ is decreased to be less than the total of the input voltage Vin− and a hysteresis bandwidth BW, the feedback voltage Vout is then transited to a low level.

Figure 8A:
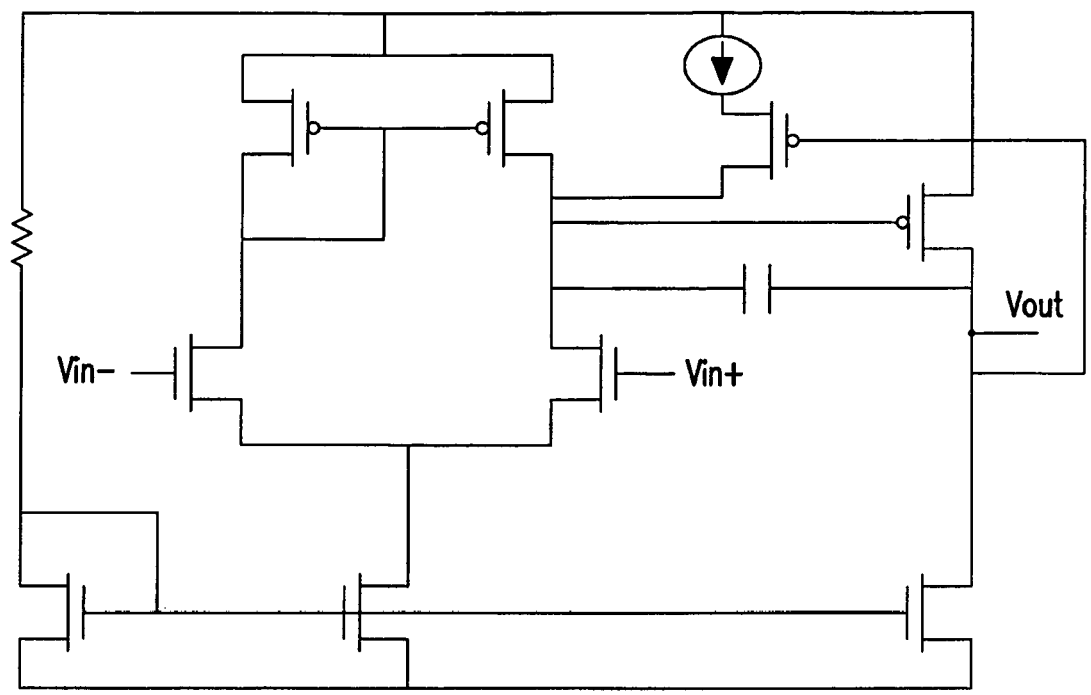
FIG. 8A illustrates another example of the comparator COMP1.
Figure 8B:
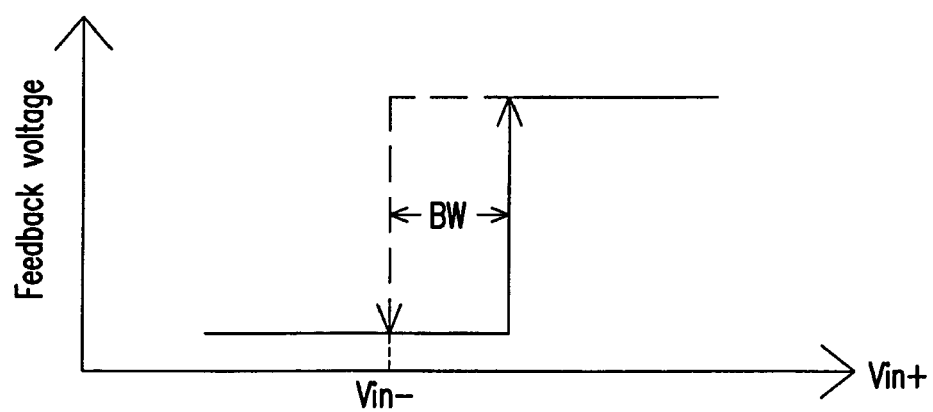
FIG. 8B illustrates a relationship between input voltages and a feedback voltage output by the comparator depicted in FIG. 8A.

Please refer to FIGS. 8A and 8B. FIG. 8A illustrates another example of the comparator COMP1, and FIG. 8B illustrates a relationship between the input voltages and the feedback voltage output by the comparator depicted in FIG. 8A. The comparator depicted in FIG. 8A is another hysteresis comparator. As shown in FIG. 8B, when the input voltage Vin+ is decreased little by little to be less than the input voltage Vin−, the feedback voltage Vout is output at a low level. After that, when the input voltage Vin+ is gradually increased to be greater then the input voltage Vin−, the feedback voltage Vout stays unchanged. After the input voltage Vin+ is increased to be greater than the total of the input voltage Vin− and the hysteresis bandwidth BW, the feedback voltage Vout is then transited to a high level.

Figure 9:
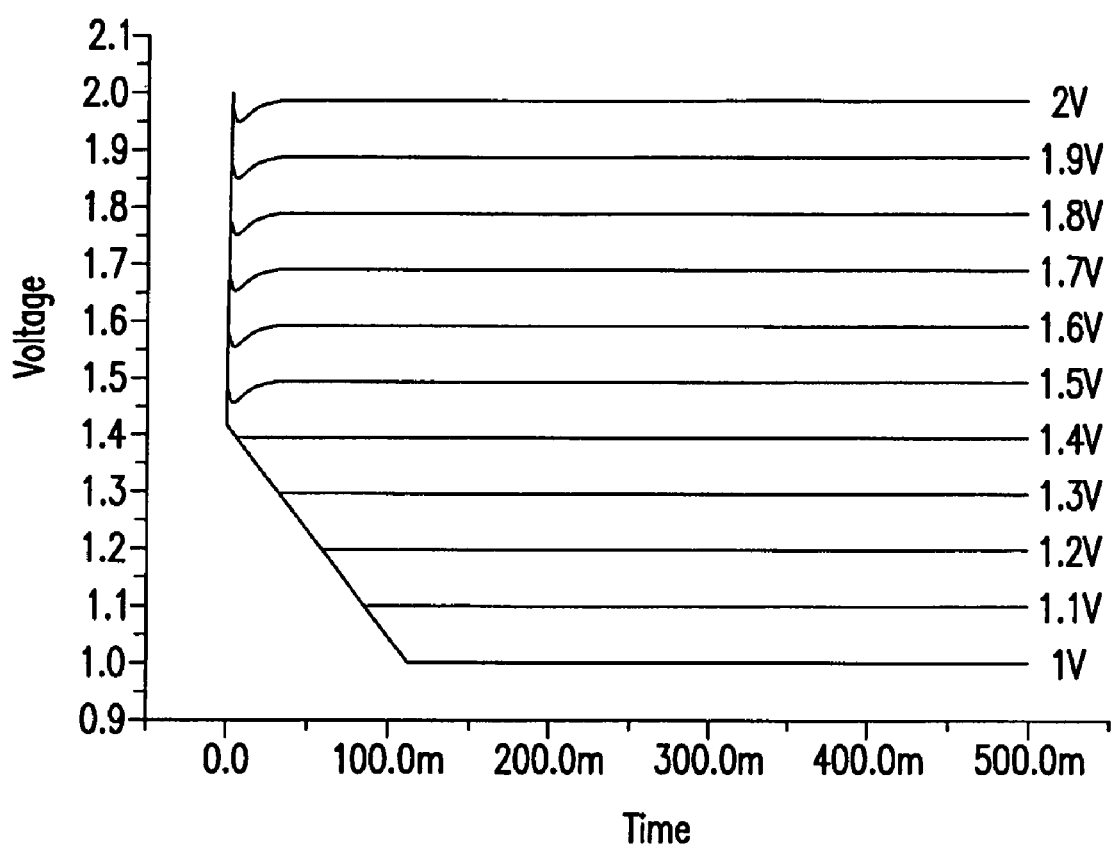
FIG. 9 illustrates a relationship between the feedback voltage Vout and time according to the second embodiment of the present invention after a hysteresis comparator is applied.

Next, please refer to FIG. 9 which illustrates a relationship between the feedback voltage Vout and time according to the second embodiment of the present invention after the hysteresis comparator is applied. Apparently, the oscillated feedback voltage as discussed hereinbefore is replaced by a stable feedback voltage.

The following table 2 indicates simulated results of a relationship between the stored voltage and the read voltage according to the second embodiment. The simulation is conducted upon different manufacturing conditions ff, fs, sf, ss, and tt. Here, ff denotes a simulation model selected from a fast P-type transistor and a fast N-type transistor, fs denotes a simulation model selected from the fast P-type transistor and a slow N-type transistor, sf denotes a simulation model selected from a slow P-type transistor and the fast N-type transistor, ss denotes a simulation model selected from the slow P-type transistor and the slow N-type transistor, and tt denotes a simulation model selected from a standard P-type transistor and a standard N-type transistor.

TABLE 2

|      | tt       | sf       | fs       | ss       | ff       |
|------|----------|----------|----------|----------|----------|
| 1 V  | 1.000 V  | 0.9979 V | 1.0016 V | 0.9966 V | 0.9958 V |
| 1.1 V| 1.0979 V | 1.0980 V | 1.1034 V | 1.0967 V | 1.0941 V |
| 1.2 V| 1.1976 V | 1.1957 V | 1.2020 V | 1.1963 V | 1.1946 V |
| 1.3 V| 1.2970 V | 1.2960 V | 1.3022 V | 1.2965 V | 1.2943 V |
| 1.4 V| 1.3975 V | 1.3948 V | 1.4001 V | 1.3968 V | 1.3940 V |
| 1.5 V| 1.5031 V | 1.4956 V | 1.5007 V | 1.4976 V | 1.4919 V |
| 1.6 V| 1.6017 V | 1.5981 V | 1.6002 V | 1.5966 V | 1.5919 V |
| 1.7 V| 1.7025 V | 1.6975 V | 1.6978 V | 1.6955 V | 1.6904 V |
| 1.8 V| 1.8014 V | 1.7981 V | 1.7993 V | 1.7958 V | 1.7901 V |
| 1.9 V| 1.9015 V | 1.8971 V | 1.9047 V | 1.8951 V | 1.8886 V |
| 2.0 V| 2.0008 V | 1.9965 V | 1.9990 V | 1.9975 V | 1.9890 V |

It can be clearly observed from Table 2 that the maximum error occurs when the written voltage is at 1.9V and the simulation model is ff. The written voltage ranges from 1V to 2V, and therefore the resolution can reach 6 bits on condition that 1V (the written voltage)/0.0114V (the maximum error)=87.7.

To sum up, the adjustment of the currents enables the signals of the currents or the signals of the voltages to be written into the nonvolatile analog memory according to the present invention. Thereby, the data can be stably stored. Furthermore, when the data stored in the nonvolatile analog memory is read, the stored data is unlikely to be altered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nonvolatile analog memory, having a floating gate point, the nonvolatile analog memory comprising:
   a first current source, controlled by a voltage value at the floating gate point and generating a first current;
   a second current source, generating a second current; and
   a current adjuster, receiving the first current, the second current, and a reference current and turning on or turning off a current path of the second current according to the reference current and the first current,
   wherein the first current is adjusted according to the reference current when the current path of the second current is turned on, and the first current is equal to the reference current.

2. The nonvolatile analog memory as claimed in claim 1, wherein the first current source comprises:
a first transistor, comprising a gate, a first source/drain, and a second source/drain, wherein the gate of the first transistor is coupled to the floating gate point, the first source/drain of the first transistor is coupled to a system voltage, and the second source/drain of the first transistor generates the first current.

3. The nonvolatile analog memory as claimed in claim 1, wherein the second current source comprises:
a second transistor, comprising a gate, a first source/drain, and a second source/drain, wherein the gate of the second transistor is coupled to the floating gate point, the first source/drain of the second transistor is coupled to a first voltage, and the second source/drain of the second transistor generates the second current.

4. The nonvolatile analog memory as claimed in claim 1, wherein the current adjuster comprises:
a switch, turning on or turning off the current path of the second current; and
a current comparator, enabling/disabling the switch by comparing the first current with the reference current.

5. The nonvolatile analog memory as claimed in claim 4, wherein the current comparator comprises a hysteresis comparator.

6. The nonvolatile analog memory as claimed in claim 4, wherein the switch is disabled when the first current is not less than the reference current, and the switch is enabled when the first current is less than the reference current.

7. The nonvolatile analog memory as claimed in claim 4, the switch comprising a third transistor including a gate, a first source/drain, and a second source/drain, wherein the gate of the third transistor is coupled to the current comparator, the first source/drain of the third transistor receives the second current, and the second source/drain of the third transistor is coupled to a ground voltage.

8. The nonvolatile analog memory as claimed in claim 2, further comprising a first capacitor coupled between the system voltage and the floating gate point for stabilizing the voltage value at the floating gate point.

9. The nonvolatile analog memory as claimed in claim 1, further comprising a second capacitor, wherein an end of the second capacitor is coupled to the floating gate point, and the other end of the second capacitor is floating.

10. The nonvolatile analog memory as claimed in claim 9, wherein the voltage value at the floating gate point is increased by electron tunneling through the second capacitor, such that the first current is less than the reference current, and data is then written into the nonvolatile analog memory.

11. The nonvolatile analog memory as claimed in claim 1, further comprising a reference current source generating the reference current.

12. The nonvolatile analog memory as claimed in claim 1, further comprising an output circuit coupled to the current adjustor for outputting a third current based on the first current.

13. The nonvolatile analog memory as claimed in claim 1, further comprising:
an amplifier, comprising a first input end, a second input end, and an output end, the output end being coupled to the first input end, the second input end being coupled to the floating gate point, wherein the amplifier detects the voltage value at the floating gate point.

* * * * *